(12) United States Patent
Shinohara

(10) Patent No.: US 11,431,922 B2
(45) Date of Patent: Aug. 30, 2022

(54) PHOTOELECTRIC CONVERSION APPARATUS, IMAGING SYSTEM, AND MOVING OBJECT, WITH HIGH SENSITIVITY AND SATURATION CHARGE

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/442,001

(22) Filed: Jun. 14, 2019

(65) Prior Publication Data
US 2019/0394411 A1   Dec. 26, 2019

(30) Foreign Application Priority Data

Jun. 26, 2018  (JP) .............................. JP2018-121327

(51) Int. Cl.
*H04N 5/341* (2011.01)
*H01L 27/146* (2006.01)
*H01L 27/148* (2006.01)

(52) U.S. Cl.
CPC ....... *H04N 5/341* (2013.01); *H01L 27/14605* (2013.01); *H01L 27/14812* (2013.01)

(58) Field of Classification Search
CPC ...... H04N 5/341; H04N 5/3696; H04N 5/335; H01L 27/14812; H01L 27/14605; H01L 27/14643; H01L 27/14612; H01L 27/14603; H01L 27/14629; H01L 27/1461; H01L 27/1463; H01L 27/146–14607; H01L 27/14625; H01L 27/14627
See application file for complete search history.

(56) References Cited

U.S. PATENT DOCUMENTS

| | | | |
|---|---|---|---|
| 2006/0049431 A1* | 3/2006 | Kaida | H01L 29/76816 257/222 |
| 2013/0083225 A1* | 4/2013 | Minowa | H01L 27/1464 348/294 |
| 2015/0060951 A1 | 3/2015 | Hynecek | |
| 2016/0284758 A1* | 9/2016 | Hirota | H01L 27/1463 |
| 2018/0308895 A1* | 10/2018 | Kim | H01L 27/14806 |
| 2018/0350864 A1* | 12/2018 | Toyoguchi | H01L 27/1461 |

FOREIGN PATENT DOCUMENTS

| | | |
|---|---|---|
| JP | 2001-53260 A | 2/2001 |
| JP | 2008-078302 A | 4/2008 |
| JP | 2014-165286 A | 9/2014 |
| JP | 2017-216649 A | 12/2017 |
| JP | 2018-056962 A | 4/2018 |

* cited by examiner

*Primary Examiner* — Ismail A Muse
*Assistant Examiner* — Gustavo G Ramallo
(74) *Attorney, Agent, or Firm* — Canon U.S.A., Inc. IP Division

(57) ABSTRACT

A solid-state imaging apparatus includes first, second, and third semiconductor regions. The third semiconductor region has a second conductivity type. The third semiconductor region extends from a region below the second semiconductor region of a first pixel to a region below the second semiconductor region of a second pixel in the first and second pixels adjacent to each other among a plurality of pixels.

16 Claims, 15 Drawing Sheets

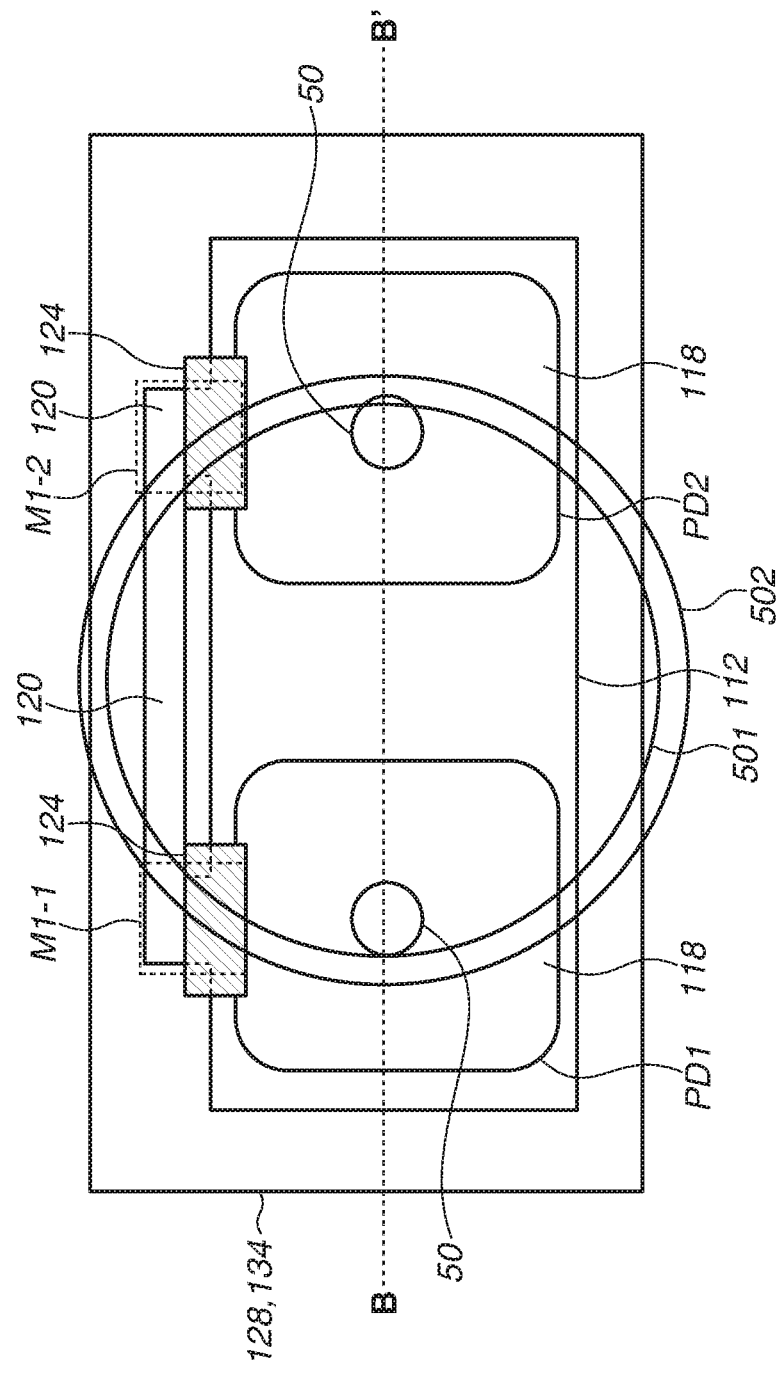

PHOTOELECTRIC CONVERSION APPARATUS, IMAGING SYSTEM, AND MOVING OBJECT, WITH HIGH SENSITIVITY AND SATURATION CHARGE

BACKGROUND

Field

One disclosed aspect of the embodiments relates to a solid-state imaging apparatus, an imaging system, a moving object, and a method for manufacturing a solid-state imaging apparatus.

Description of the Related Art

For solid-state imaging apparatuses represented by a charge coupled device (CCD) image sensor and a complementary metal-oxide semiconductor (CMOS) image sensor, sensitivity and saturation charge amount of a photoelectronic conversion unit are important characteristics affecting the performance of the solid-state imaging apparatus. As a current mainstream of the photoelectric conversion unit of the CCD image sensor or the CMOS image sensor, the buried photodiode is in use which includes a PN junction between a (P-type) semiconductor region provided on a surface portion of a semiconductor substrate and a (N-type) semiconductor region serving as a charge accumulation region. In this case, signal carriers generated in the photoelectric conversion unit are electrons.

The structure of a substrate on which the photoelectric conversion unit is disposed include an N-type substrate structure and a P-type well structure. The N-type substrate structure is such a structure that a P-type semiconductor region is provided at a deep portion in the N-type semiconductor substrate having low impurity concentration and the photoelectric conversion unit is disposed within an N-type semiconductor region on the substrate surface portion, which is electrically isolated from the deep portion of the substrate. The P-type well structure is such a structure that the photoelectric conversion unit is disposed in a P-type well provided on the surface portion of the semiconductor substrate.

The N-type substrate structure is characterized by its high sensitivity because signal charge generated in the N-type semiconductor region can be easily collected due to drift. The solid-state imaging apparatus including the photoelectric conversion unit having the N-type substrate structure is discussed in, for example, Japanese Patent Application Laid-Open No. 2008-078302. On the other hand, the P-type well structure is characterized by its large saturation charge amount because a PN junction capacitor is formed between the N-type semiconductor region serving as the charge accumulation region and the P-type well. The solid-state imaging apparatus including the photoelectric conversion unit having the P-type well structure is discussed in, for example, Japanese Patent Application Laid-Open No. 2014-165286. The solid-state imaging apparatuses discussed in Japanese Patent Application Laid-Open Nos. 2008-078302 and 2014-165286 each include the P-type semiconductor region disposed below the N-type semiconductor region serving as the charge accumulation region to thus increase the PN junction capacitance, thereby increasing the saturation charge amount of the photoelectric conversion unit.

The solid-state imaging apparatuses disclosed in Japanese Patent Application Laid-Open Nos. 2008-078302 and 2014-165286 are not sufficiently discussed and need more consideration about a structure capable of achieving both the high sensitivity and the large saturation charge amount of the photoelectric conversion unit.

SUMMARY

The disclosure is directed to providing a solid-state imaging apparatus having the structure capable of achieving both the high sensitivity and the large saturation charge amount of the photoelectric conversion unit.

According to an aspect of the embodiments, a solid-state imaging apparatus includes a plurality of pixels including a plurality of first semiconductor regions having a first conductivity type. Each of the plurality of pixels includes a plurality of photoelectric conversion units with respect to one micro lens. Each of the plurality of photoelectric conversion units includes a first semiconductor region, of the plurality of first semiconductor region where a signal charge is accumulated. The pixel includes, a second semiconductor region having a second conductivity type opposite to the first semiconductor region, the second semiconductor region being disposed below the plurality of first semiconductor regions of the pixels so as to overlap with the plurality of first semiconductor regions in a planar view, a third semiconductor region having the second conductivity type, the third semiconductor region being disposed at a position between the plurality of first semiconductor regions and deeper than the second semiconductor region in the planar view.

Further features of the disclosure will become apparent from the following description of exemplary embodiments with reference to the attached drawings.

BRIEF DESCRIPTION OF THE DRAWINGS

FIG. 14 illustrates a planar layout of the pixel of the solid-state imaging apparatus.

DESCRIPTION OF THE EMBODIMENTS

A solid-state imaging apparatus according to a first exemplary embodiment will be described with reference to FIGS. 1 to 5.

Figure 1:
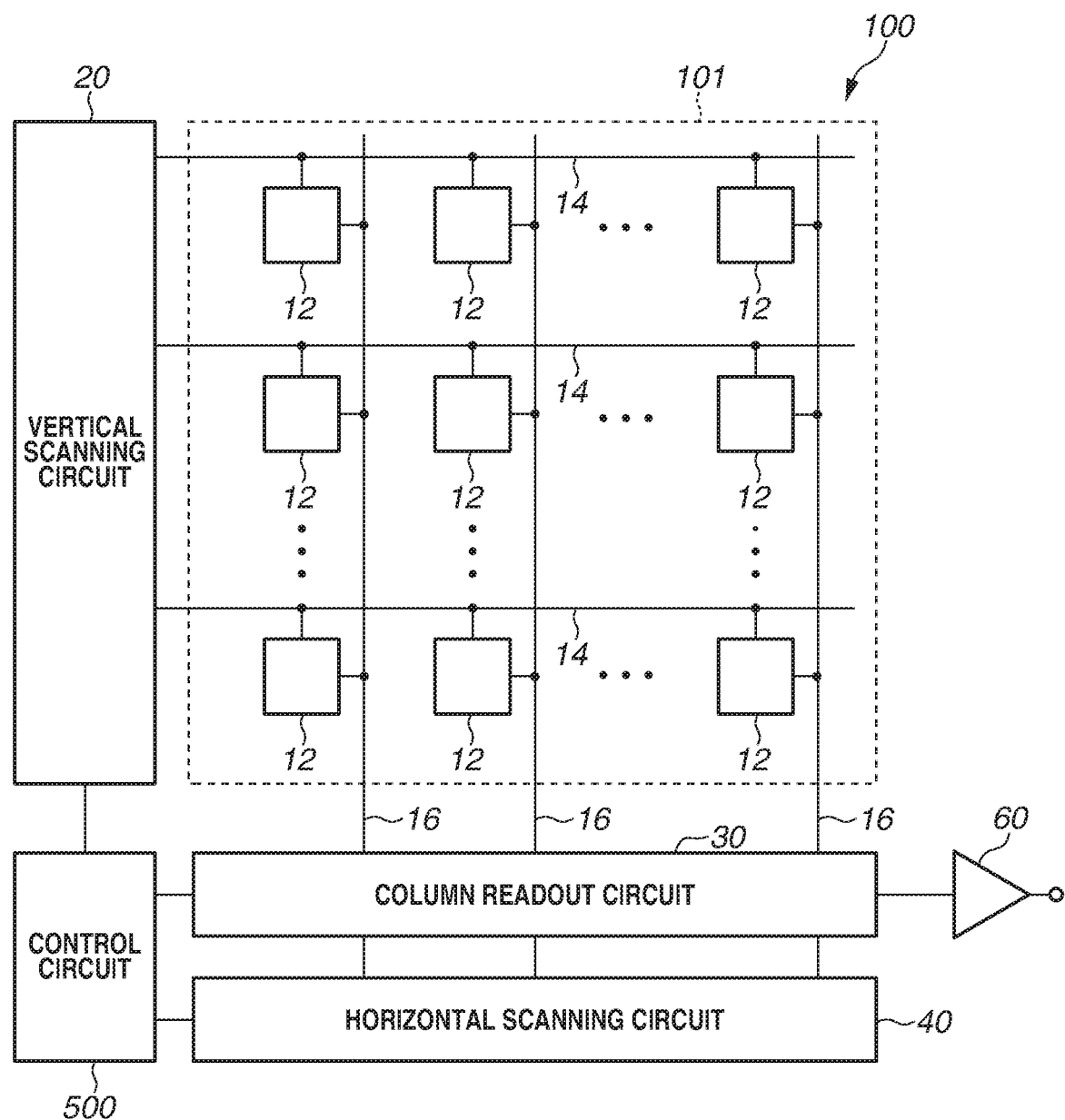
FIG. 1 is a block diagram illustrating a schematic structure of a solid-state imaging apparatus.
Figure 2:
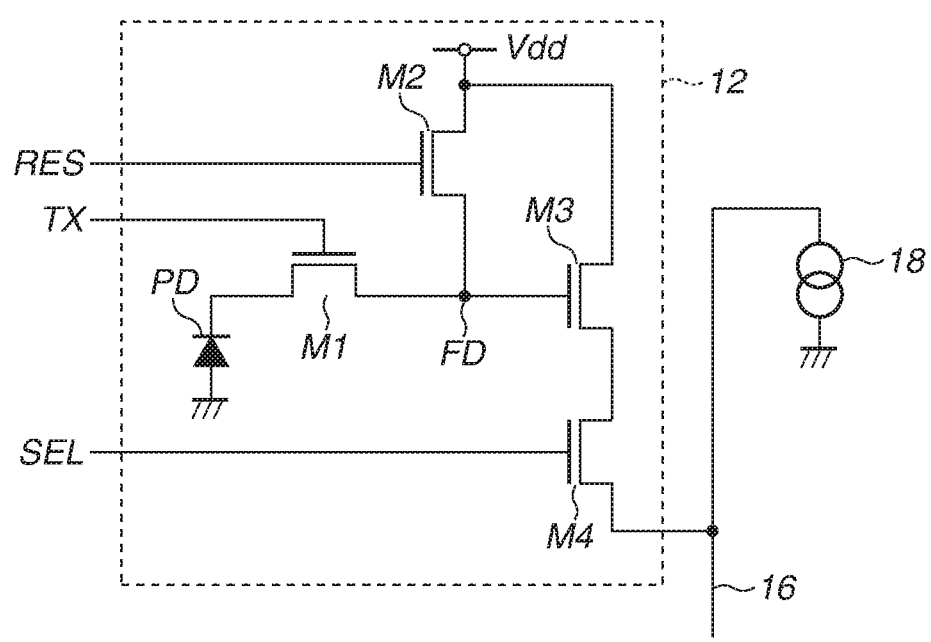
FIG. 2 is an equivalent circuit diagram of a pixel of the solid-state imaging apparatus.
Figure 3:
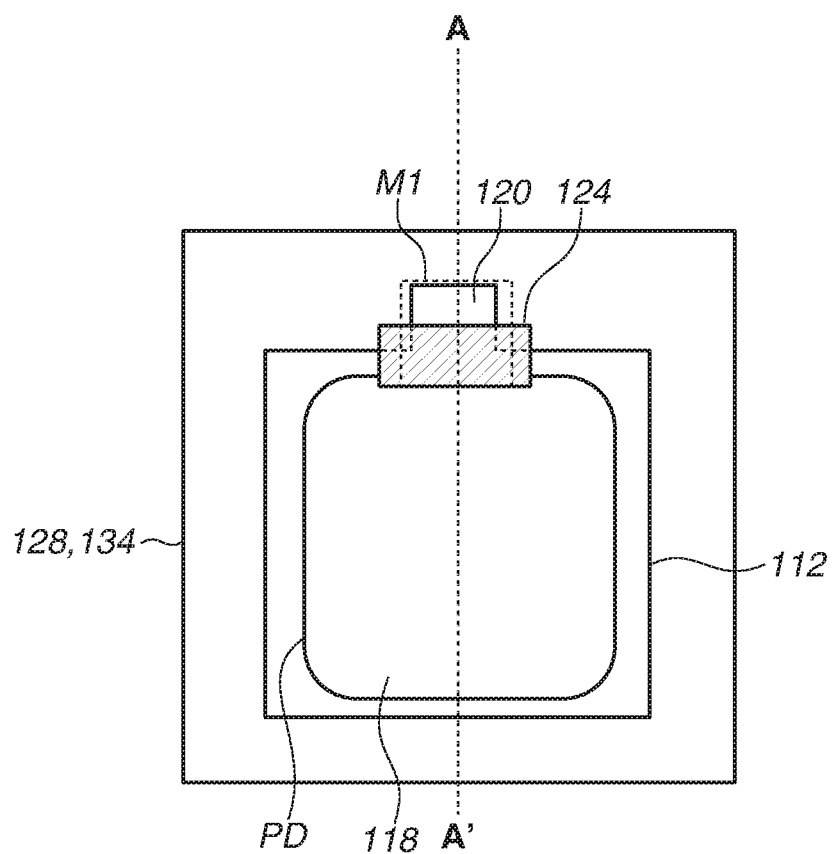
FIG. 3 illustrates a planar layout of the pixel of the solid-state imaging apparatus.
Figure 4:
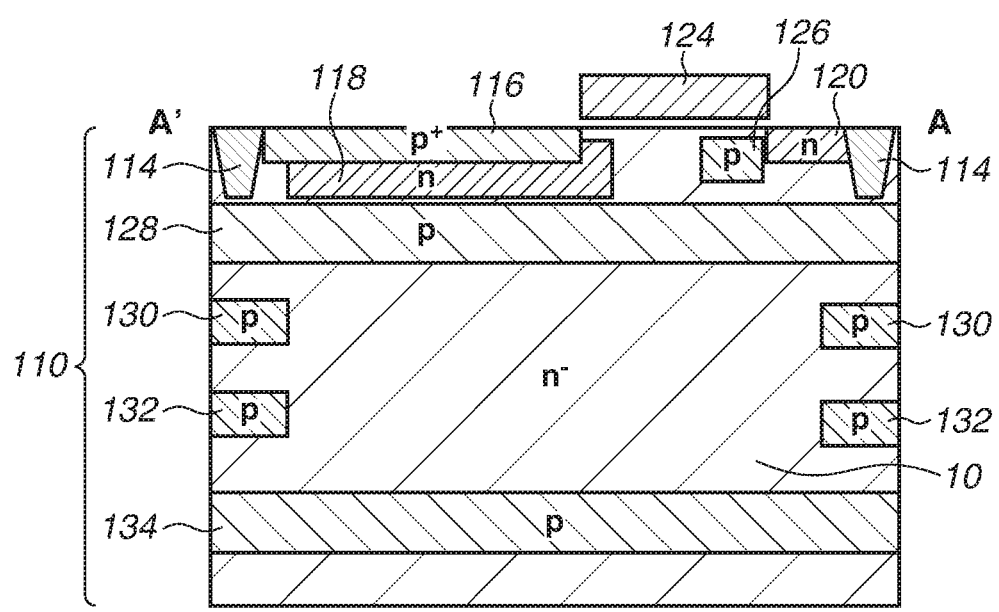
FIG. 4 is a schematic cross-sectional view of the pixel of the solid-state imaging apparatus.
Figure 5:
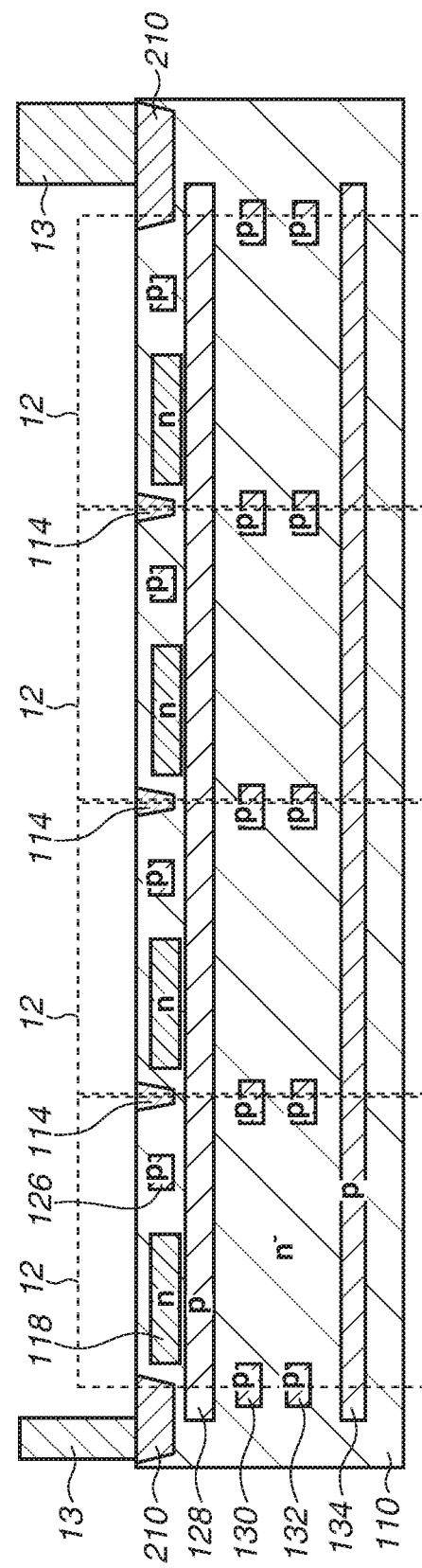
FIG. 5 schematically illustrates a method for manufacturing the pixel of the solid-state imaging apparatus.

FIG. 1 is a block diagram illustrating a schematic configuration of the solid-state imaging apparatus according to the present exemplary embodiment. FIG. 2 is an equivalent circuit diagram of a pixel of the solid-state imaging apparatus according to the present exemplary embodiment. FIG. 3 illustrates a planar layout of the pixel of the solid-state imaging apparatus according to the present exemplary embodiment. FIG. 4 is a schematic cross-sectional view of the pixel of the solid-state imaging apparatus according to the present exemplary embodiment. FIG. 5 schematically illustrates a method for manufacturing the pixel of the solid-state imaging apparatus according to the present exemplary embodiment.

A solid-state imaging apparatus 100 according to the present exemplary embodiment includes a pixel region 101, a vertical scanning circuit 20, a column readout circuit 30, a horizontal scanning circuit 40, a control circuit 500, and an output circuit 60, as illustrated in FIG. 1.

A plurality of pixels 12 arrayed in a matrix form across a plurality of rows and a plurality of columns, is provided in the pixel region 101. A control signal line 14 is arranged for each of the rows of the pixel array in the pixel region 101 while extending in a row direction (a horizontal direction in FIG. 1). The control signal line 14 is connected to each of the pixels 12 lined up in the row direction, and serves as a common control line shared among these pixels 12. Further, a vertical output line 16 is arranged for each of the columns of the pixel array in the pixel region 101 while extending in a column direction (a vertical direction in FIG. 1). The vertical output line 16 is connected to each of the pixels 12 lined up in the column direction, and serves as a common signal line shared among these pixels 12.

The control signal line 14 for each of the rows is connected to the vertical scanning circuit 20. The vertical scanning circuit 20 is a circuit that supplies a control signal for driving a readout circuit within the pixel 12, to the pixel 12 via the control signal line 14 when reading out a pixel signal from the pixel 12. The end of the vertical output line 16 is connected to the column readout circuit 30. The pixel signal read out from the pixel 12 is inputted to the column readout circuit 30 via the vertical output line 16. The column readout circuit 30 is the circuit that performs predetermined signal processing, such as signal amplification and analog-to-digital (AD) conversion, on the pixel signal read out from the pixel 12. The column readout circuit 30 can include a differential amplification circuit, a sample-and-hold circuit, and an AD conversion circuit.

The horizontal scanning circuit 40 is a circuit that supplies, to the column readout circuit 30, a control signal for sequentially transferring the pixel signal processed in the column readout circuit 30 to the output circuit 60 for each of the columns. The control circuit 500 is a circuit unit for supplying a control signal for controlling operation of the vertical scanning circuit 20, the column readout circuit 30, and the horizontal scanning circuit 40 and its timing. The output circuit 60 includes a buffer amplifier and a differential amplifier and functions to output the pixel signal read out from the column readout circuit 30 to a signal processing unit outside the solid-state imaging apparatus 100.

Each of the pixels 12 includes a photoelectric conversion unit PD, a transfer transistor M1, a reset transistor M2, an amplification transistor M3, and a selection transistor M4, as illustrated in FIG. 2. The photoelectric conversion unit PD is, for example, a photodiode, and its anode is connected to the ground voltage line and its cathode corresponds to a source of the transfer transistor M1. A drain of the transfer transistor M1 is connected to a source of the reset transistor M2 and the gate of the amplification transistor M3. A connection node among the drain of the transfer transistor M1, the source of the reset transistor M2, and the gate of the amplification transistor M3 is a so-called floating diffusion (FD), and forms a charge-voltage conversion unit. A drain of the reset transistor M2 and a drain of the amplification transistor M3 are connected to a power source voltage line (Vdd). A source of the amplification transistor M3 is connected to a drain of the selection transistor M4. A source of the selection transistor M4 is connected to the vertical output line 16. A current source 18 is connected to the other end of the vertical output line 16.

The control signal line 14 includes a transfer gate signal line TX, a reset signal line RES, and a selection signal line SEL, in the case of the circuit configuration illustrated in FIG. 2. The transfer gate signal line TX is connected to a gate of the transfer transistor M1. The reset signal line RES is connected to a gate of the reset transistor M2. The selection signal line SEL is connected to a gate of the selection transistor M4.

The photoelectric conversion unit PD converts (photoelectrically converts) incident light into a charge having an amount according to a light amount thereof, and accumulates the generated charge. The transfer transistor M1 transfers the charge in the photoelectric conversion unit PD to the floating diffusion FD by switch-on. The floating diffusion PD shows a signal voltage corresponding to the amount of the charge transferred from the photoelectric conversion unit PD. The voltage is generated by a charge-voltage conversion based on the FD capacitance. The amplification transistor M3 is configured such that a power source voltage is supplied to the drain thereof and a bias current is supplied from the current source 18 to the source thereof via the selection transistor M4. The amplification transistor M3 forms an amplification unit (a source follower circuit) in which the gate serves as an input node. Thus, the amplification transistor M3 outputs a signal based on the voltage of the floating diffusion FD to the vertical output line 16 via the selection transistor M4. The reset transistor M2 resets the floating diffusion FD to a voltage corresponding to the power source voltage Vdd by switch-on.

FIG. 3 illustrates the planar layout of the pixel 12 of the solid-state imaging apparatus 100 according to the present exemplary embodiment. FIG. 4 is a schematic cross-sectional view taken along a line A-A' illustrated in FIG. 3. FIGS. 3 and 4 illustrate only the photoelectric conversion unit PD and the transfer transistor M1 among the components of the pixel 12. FIG. 3 illustrates only the planar layout of one pixel 12, but, in reality, the pixels are arranged periodically with the predetermined horizontal pitch and the vertical pitch.

An element isolation/insulation region 114, which defines an active region 112, is provided on a surface portion of an N-type semiconductor substrate 110 having a low impurity concentration. The photodiode forming the photoelectric conversion unit PD, the transfer transistor M1, and the floating diffusion FD as a charge holding unit that holds the charge transferred from the photoelectric conversion unit PD are disposed in the active region 112.

The photoelectric conversion unit PD is an embedded photodiode including a P-type semiconductor region 116 provided on a surface portion of the active region 112 of the semiconductor substrate 110, and an N-type semiconductor region 118 provided in contact with a lower portion of the P-type semiconductor region 116. The N-type semiconductor region 118 is a charge accumulation layer for accumulating the signal charge (an electron) generated in the photoelectric conversion unit PD.

The portion of FD, N-type semiconductor region 120 is formed, on the surface portion of the active region 112 of the semiconductor substrate 110 and is separated from the N-type semiconductor region 118.

The transfer transistor M1 includes a gate electrode 124 provided on the semiconductor substrate 110 between the N-type semiconductor region 118 and the N-type semiconductor region 120 via a gate insulation film 122. Within the semiconductor substrate 110 between the N-type semiconductor region 118 and the N-type semiconductor region 120, a P-type semiconductor region 126 for electrically isolating them from each other is provided.

A P-type semiconductor region 128 is provided below the N-type semiconductor region 118. The P-type semiconductor region 128 serves as a depletion suppression layer for suppressing the spread of a depletion layer downward from the N-type semiconductor region 118.

P-type semiconductor regions 130, 132, and 134 are provided at deep portions of the semiconductor substrate 110. The P-type semiconductor region 130 performs a function of isolating the pixels 12 therebetween inside the semiconductor substrate 110. The P-type semiconductor region 132 performs a function of isolating the pixels 12 therebetween inside the semiconductor substrate 110 provided deeper than the P-type semiconductor region 130. The P-type semiconductor region 134 is provided to define a depth for effectively collecting the signal charge generated in the semiconductor substrate 110. In the present specification, the surface portion of the semiconductor substrate 110 electrically isolated by the P-type semiconductor region 126 may be referred to as the semiconductor region.

A PN junction capacitor is formed between the N-type semiconductor region 118 and the P-type semiconductor region 128 by providing the P-type semiconductor region 128 below the N-type semiconductor region 118. As can be understood from a relational expression, $Q=CV$, an accumulated charge amount Q increases as a PN junction capacitance C increases when a certain given reverse bias voltage V is applied to the PN junction of the photoelectric conversion unit PD. The signal charge accumulated in the N-type semiconductor region 118 is transferred to floating diffusion 120, but the signal charge in the N-type semiconductor region 118 cannot be transferred completely when a potential of the N-type semiconductor region 118 reaches a certain predetermined potential determined based on the power source voltage or the like. In other words, because the reverse bias voltage within which signal charge can be transferred completely is limited, a saturation charge amount increases in proportion to the PN junction capacitance of the photoelectric conversion unit PD. Therefore, the provision of the P-type semiconductor region 128 can increase the saturation charge amount of the N-type semiconductor region 118 as the charge accumulation layer.

The P-type semiconductor region 128 and the P-type semiconductor region 134 are arranged so as to overlap each other in a planar view, as illustrated in FIG. 3. Typically, the P-type semiconductor region 128 and the P-type semiconductor region 134 are laid out matching each other in the planar view in the present exemplary embodiment.

In the present specification, the planar view refers to a two-dimensional planar view acquired by projecting each of the components of the solid-state imaging apparatus 100 on a surface which is in parallel with the surface of the semiconductor substrate 110, and, for example, corresponds to the planar layout diagram of FIG. 3.

FIG. 5 illustrates cross-sectional structures of the plurality of pixels 12. FIG. 5 illustrates a part of processes for manufacturing the solid-state imaging apparatus 100.

The process for manufacturing the solid-state imaging apparatus 100 illustrated in FIG. 5 indicates a process for forming the P-type semiconductor region 134 and the P-type semiconductor region 128. A mask 13 masks regions other than regions in which the P-type semiconductor regions 134 and 128 are formed in an ion implantation process for forming the P-type semiconductor region 134 and the P-type semiconductor region 128. Prior to the present process, an isolation region 210 has been formed. The isolation region 210 isolates the pixel region 101 including the N-type semiconductor region 118, the P-type semiconductor regions 126, 130, and 132, the element isolation/insulation region 114, and from a peripheral circuit region. This peripheral circuit region refers to, for example, a region in which at least the vertical scanning circuit 20 or the column readout circuit 30 is disposed in the case of FIG. 1. In a case of a stack-type solid-state imaging apparatus in which a plurality of semiconductor substrates is stacked, the peripheral circuit region may not be formed on a first semiconductor substrate on which the pixel region 101 is disposed. In this case, the peripheral circuit region is formed on another second semiconductor substrate. In such a case, the first semiconductor substrate may be provided with a pad for feeding and receiving a signal to and from the second semiconductor substrate, or a pad to which a signal or a power source voltage is supplied from outside the solid-state imaging apparatus. In such a case, the isolation region 210 is disposed as a boundary between the pixel region 101 and the pad.

The P-type semiconductor region 134 is disposed across a plurality of pixels 12. Typically, the P-type semiconductor region 134 is disposed across the pixels 12 in a plurality of rows and a plurality of columns. Desirably, the P-type semiconductor region 134 is disposed all over the pixel region 101.

The P-type semiconductor region 128 is also disposed across a plurality of pixels 12. Typically, the P-type semiconductor region 128 is disposed across the pixels 12 in a plurality of rows and a plurality of columns. Desirably, the P-type semiconductor region 128 is disposed all over the pixel region 101.

The ion implantation is carried out for the P-type semiconductor regions 128 and 134 with use of the same mask pattern.

More specifically, patterning for forming the mask 13 is carried out by applying a photoresist on the semiconductor substrate 110, and then exposing it to the light with use of a predetermined reticle after that. Ion implantation for forming the P-type semiconductor region 134 is carried out with the patterned mask 13 provided. Then, ion implantation for forming the P-type semiconductor region 128 is carried out with the mask 13 still provided, with a lower ion acceleration energy than in the ion implantation for forming the P-type semiconductor region 134. By this method, the P-type semiconductor region 134 and the P-type semiconductor region 128 can be formed with use of the same mask pattern. As a result, the P-type semiconductor region 128 and the P-type semiconductor region 134 can be formed with fewer reticles and fewer exposure processes than when they are formed with use of different mask patterns. Therefore, the manufacturing cost can be reduced. Further, increases in the number of reticles and the number of exposure processes would increase occurrence of failures in the reticle and patterning failures in an exposure apparatus, thereby easily leading to a reduction in a yield of the solid-state imaging apparatus 100. Therefore, the solid-state imaging apparatus 100 according to the present exemplary embodiment can also improve the yield of the solid-state imaging apparatus 100 by reducing the number of reticles and the number of exposure processes.

The present method may be performed to form the P-type semiconductor region 128 by forming the mask 13 again, after removing the mask 13 and carrying out annealing after forming the P-type semiconductor region 134. Even in this case, the mask 13 for the ion implantation process for forming the P-type semiconductor region 134 and the mask 13 for the ion implantation process for forming the P-type semiconductor region 128 can also be patterned with use of the same reticle. Therefore, the number of reticles can be reduced.

Now, a mechanism of accumulating the charge in the photoelectric conversion unit PD will be described.

Figure 6:
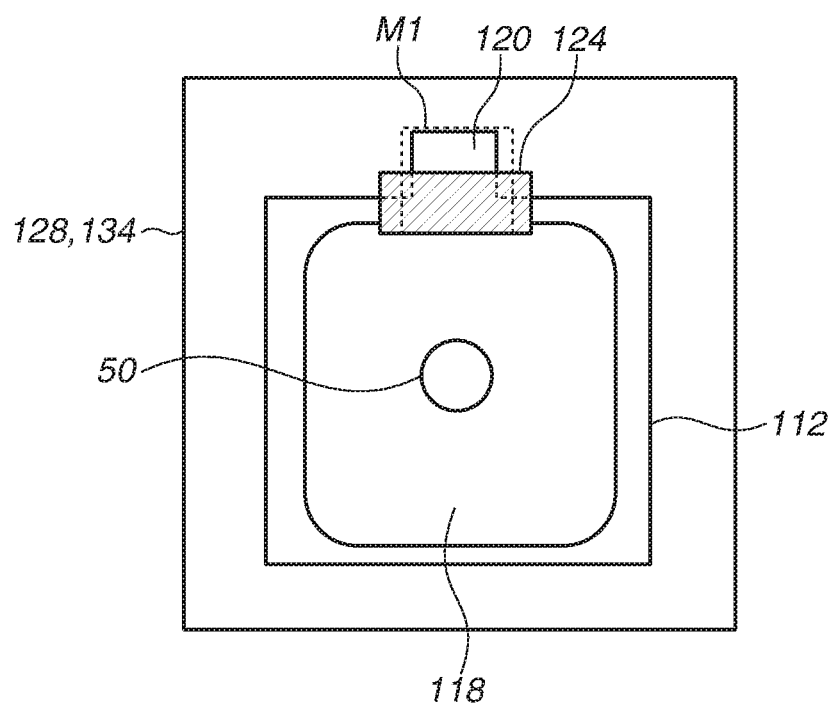
FIG. 6 illustrates a planar layout of the pixel of the solid-state imaging apparatus.
Figure 7:
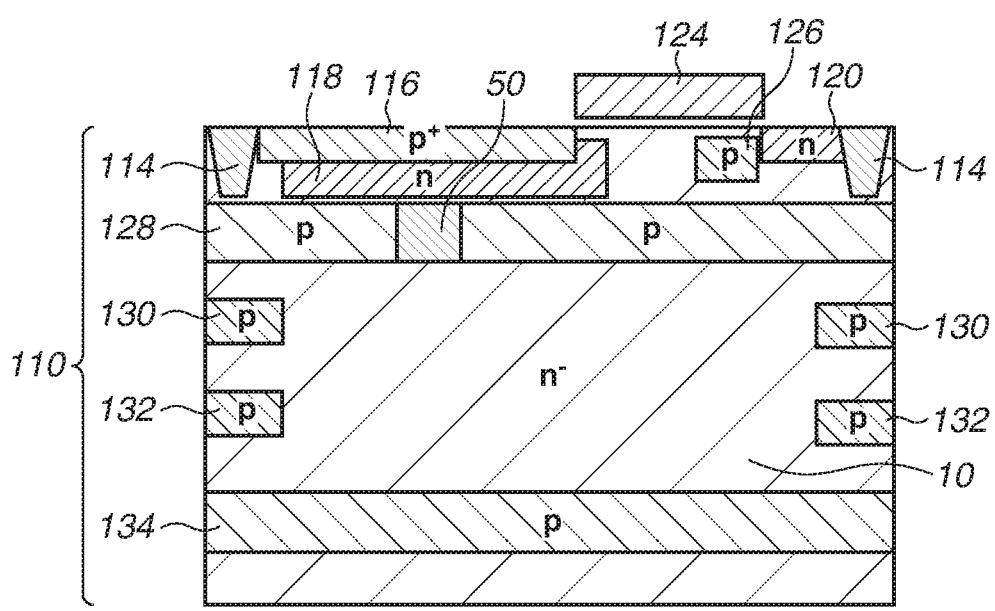
FIG. 7 is a schematic cross-sectional view of the pixel of the solid-state imaging apparatus.

FIGS. 6 and 7 illustrate a depletion layer 50 depleted in the P-type semiconductor region 128 during a charge accumulation period of the photoelectric conversion unit PD in the present exemplary embodiment. The depletion layer 50 is located approximately at a center of a region over which the P-type semiconductor region 128 overlaps the N-type semiconductor region 118 in the planar view.

Appropriately setting the impurity concentration of the P-type semiconductor region 128 allows the depletion layer 50 extending from the N-type semiconductor region 118 to penetrate through the P-type semiconductor region 128 in the depth direction. The depletion layer 50 reaches an N-type semiconductor region 10 (labeled n⁻ in the drawing) provided below the P-type semiconductor region 128 and having a lower impurity concentration than the N-type semiconductor region 118. In the P-type semiconductor region 128, the depletion layer 50 is a state of a low potential for electrons generated in the N-type semiconductor region 10. Further, typically, the P-type semiconductor regions 130 and 132 and the P-type semiconductor region 128 except for the depletion layer 50 are neutral regions behaving as a conductor due to their holes. The N-type semiconductor region 10 is typically depleted. Since the N-type semiconductor region 118 has a higher impurity concentration than the N-type semiconductor region 10 as described above, the N-type semiconductor region 118 has a lower potential than the N-type semiconductor region 10. Therefore, the electrons generated in the N-type semiconductor region 10 are moved to the N-type semiconductor region 118 through the depletion layer 50. As a result, the electrons generated in the N-type semiconductor region 10 are collected in the N-type semiconductor region 118 through the depletion layer 50. Due to this mechanism, the electrons generated in the N-type semiconductor region 10 provided deeper than the N-type semiconductor region 118 can be collected in the N-type semiconductor region 118. Therefore, more electrons can be collected with respect to the incident light amount compared to the electrons generating only in the N-type semiconductor region 118 without providing the N-type semiconductor region 10. In other words, the solid-state imaging apparatus 100 according to the present exemplary embodiment can realize a high sensitivity.

In the present exemplary embodiment, the N-type semiconductor region 10 is provided below the P-type semiconductor region 128. As another example, the solid-state imaging apparatus 100 may be configured to include a P-type well region, i.e., may be configured such that the N-type semiconductor region 10 is replaced with a P-type semiconductor region having a lower impurity concentration than the P-type semiconductor regions 128, 130, 132, and 134 in FIGS. 4 and 7. However, the N-type semiconductor region 10 serves as the semiconductor region that collects the charge in the photoelectric conversion unit PD. Therefore, the electrons can be collected more effectively, and a higher sensitivity can be realized, when the N-type semiconductor region is formed as the semiconductor region provided below the P-type semiconductor region 128.

Further, the solid-state imaging apparatus 100 according to the present exemplary embodiment may be configured to include a light guide that guides the light to the N-type semiconductor region 118. In this case, desirably, the light guide is disposed such that a bottom surface of the light guide has a portion overlapping with the N-type semiconductor region 118 in the planar view.

In the following description, a second exemplary embodiment will be described. A solid-state imaging apparatus according to the present exemplary embodiment will be described, focusing on differences from the first exemplary embodiment.

The above-described exemplary embodiment is configured such that one pixel 12 includes one photoelectric conversion unit PD. Examples of such a configuration include a configuration in which one micro lens is provided in correspondence with one photoelectric conversion unit PD although illustration thereof is omitted herein.

The present exemplary embodiment is configured such that a plurality of photoelectric conversion units PD is provided with respect to one micro lens. In such configuration, the solid-state imaging apparatus can perform a focus detection operation by the phase difference detection method or acquire information about a distance from the solid-state imaging apparatus to an object.

Figure 8:
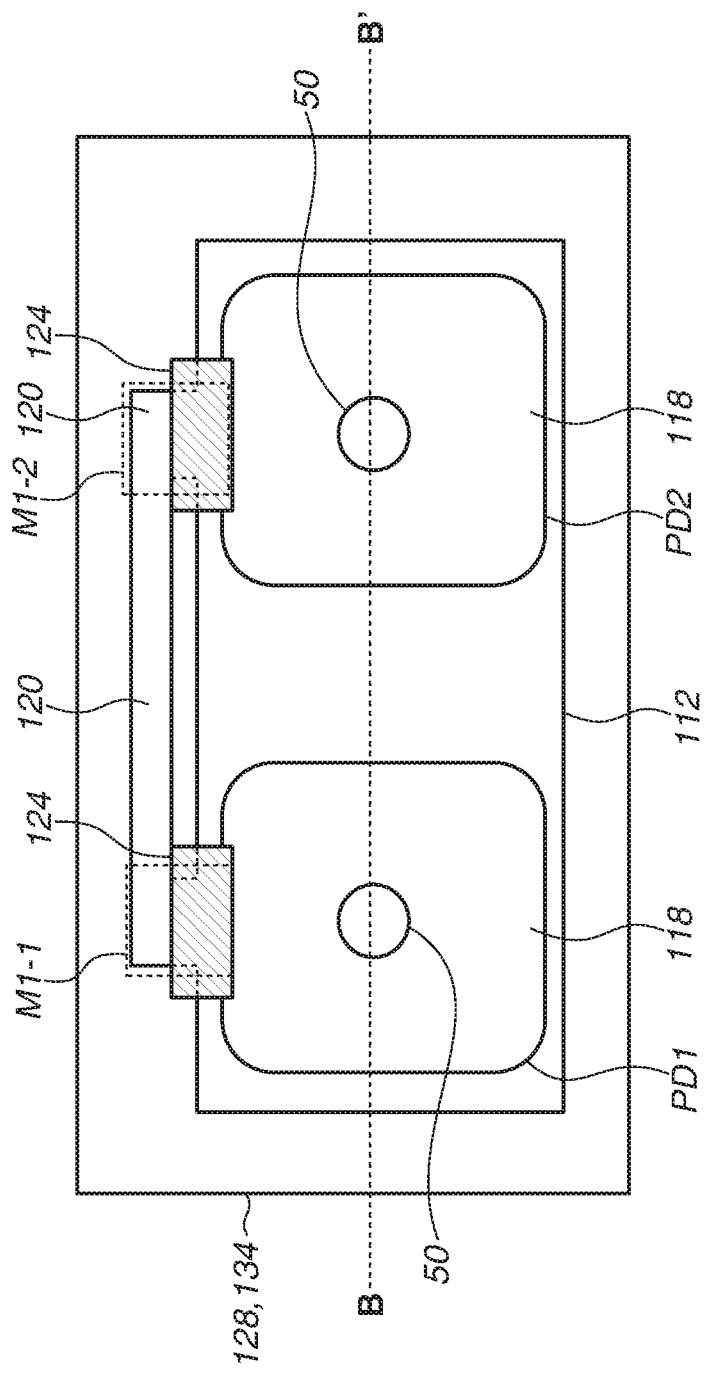
FIG. 8 illustrates a planar layout of a pixel of a solid-state imaging apparatus.

FIG. 8 is a top view of the pixel 12 according to the present exemplary embodiment. One pixel 112 illustrated in FIG. 8 includes a plurality of photoelectric conversion units PD1 and PD2. A transfer transistor M1-1 connected to the photoelectric conversion unit PD1 and a transfer transistor M1-2 connected to the photoelectric conversion unit PD2 are connected to a common N-type semiconductor region 120. In other words, the two transfer transistors M1-1 and M1-2 are connected to the common PD.

Figure 9:
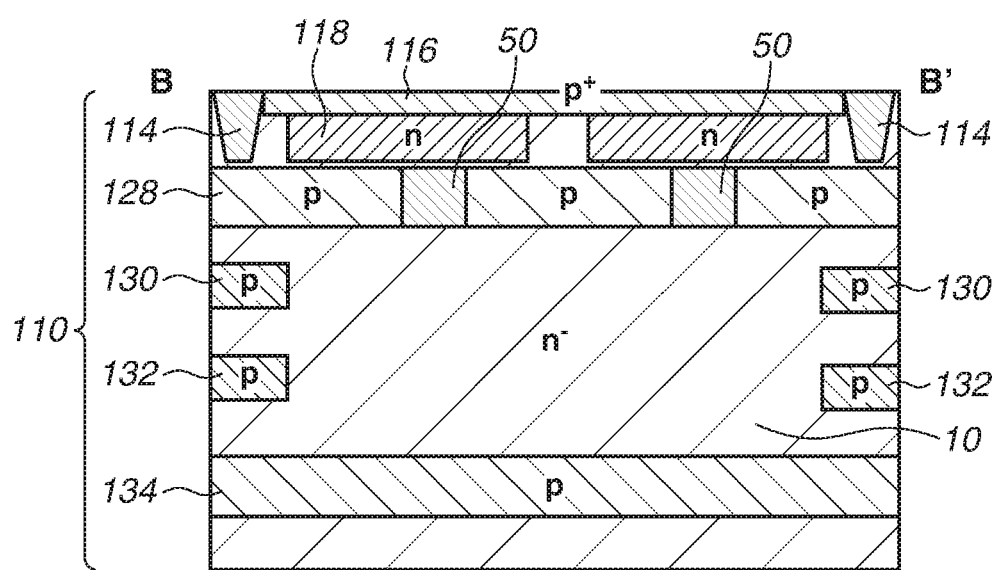
FIG. 9 illustrates a schematic cross-sectional view of the pixel of the solid-state imaging apparatus.

FIG. 9 is a cross-sectional view taken along a B-B' line illustrated in FIG. 8. In FIG. 9, members having the same functions as the members illustrated in FIG. 7 are identified by the same reference numerals as the reference numerals assigned in FIG. 7. One micro lens that collects light in the two N-type semiconductor regions 118 illustrated in FIG. 9 is provided on a top surface of the semiconductor substrate 110 although this micro lens is not illustrated.

The P-type semiconductor region 134 extends across the plurality of N-type semiconductor regions 118. Similarly, the P-type semiconductor region 128 extends across the plurality of N-type semiconductor regions 118. Also in the present exemplary embodiment, the depletion layer 50 is formed in a part of the P-type semiconductor region 128 below the N-type semiconductor region 118.

In this manner, also in the present exemplary embodiment, the depletion layer 50 is formed below each of the N-type semiconductor regions 118. As a result, in the solid-state imaging apparatus according to the present exemplary embodiment, a similar effect of the first exemplary embodiment can be acquired.

Figure 10:
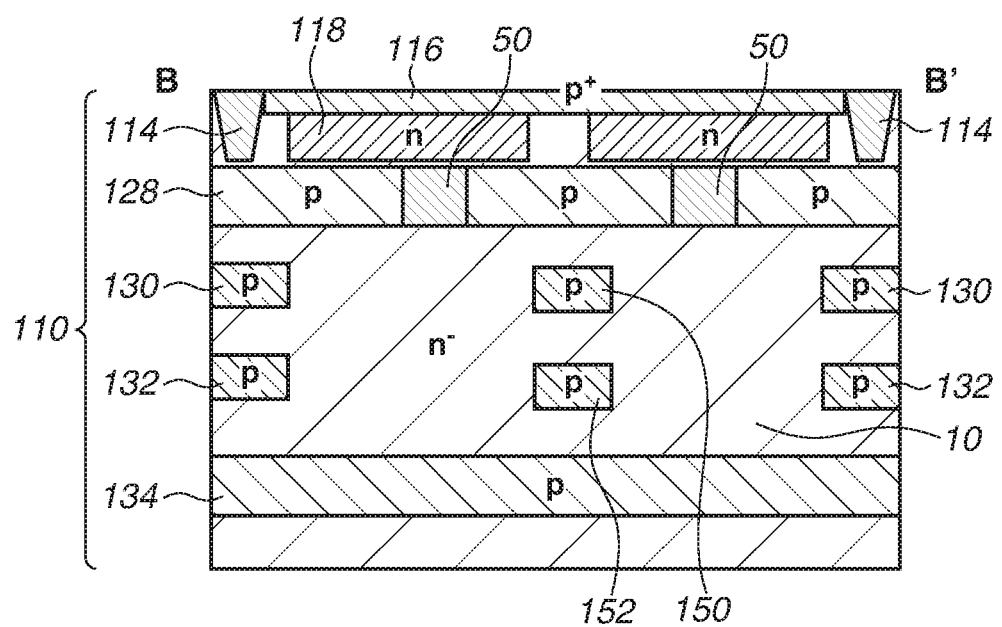
FIG. 10 illustrates a schematic cross-sectional view of the pixel of the solid-state imaging apparatus.

The present exemplary embodiment is described, referring to the example in which the N-type semiconductor region 10 extends below the plurality of the N-type semiconductor regions 118. The present exemplary embodiment is not limited to this example. For example, the solid-state imaging apparatus may be configured such that P-type semiconductor regions 150 and 152 are provided in the N-type semiconductor region 10 between respective portions below the plurality of N-type semiconductor regions 118, as illustrated in FIG. 10. In this configuration, the N-type semiconductor region 10 can be more easily depleted compared to the configuration illustrated in FIG. 9. Because the volume of the N-type semiconductor region 10 in FIG. 10 is reduced. Therefore, the configuration illustrated in FIG. 10 can acquire an effect of allowing the electrons generated in the N-type semiconductor region 10 to be more easily moved to the N-type semiconductor regions 118 due to the provision of the P-type semiconductor regions 150 and 152.

Further, also in the present exemplary embodiment, the solid-state imaging apparatus may be configured to include a light guide that guides the light to the plurality of N-type semiconductor regions 118 of one pixel 12. In this case, desirably, a bottom surface of the light guide has a portion overlapping with the plurality of N-type semiconductor regions 118 in the planar view.

As illustrated in FIG. 14, the imaging apparatus according to the present exemplary embodiment may include the light guide that guides the light to the plurality of photoelectric conversion units PD. The light guide is formed of material having higher refractive index than interlayer insulation film around with a shape of circular truncated cone. The light incident from outside the imaging apparatus enters via the incident surface 502 of the light guide into the light guide, and is emitted from an emission surface 501 to the PD units. The light guide can be formed to overlap with the depletion layers 50 in the planar view as illustrated in FIG. 14. Especially, a large number of electrons can be generated based on the incident light in the vicinity of the depletion layers 50 by forming the light guide such that the depletion layers 50 overlap with the emission surface 501 of the light guide. These charges are efficiently collected in the N-type semiconductor regions 118. Therefore, the sensitivity to the light can be improved by providing the light guide at the position overlapping with the depletion layers 50 in the planar view. More desirably, the sensitivity to the light can be improved by providing the emission surface 501 of the light guide path at the position overlapping with the depletion layers 50 in the planar view.

Figure 15:
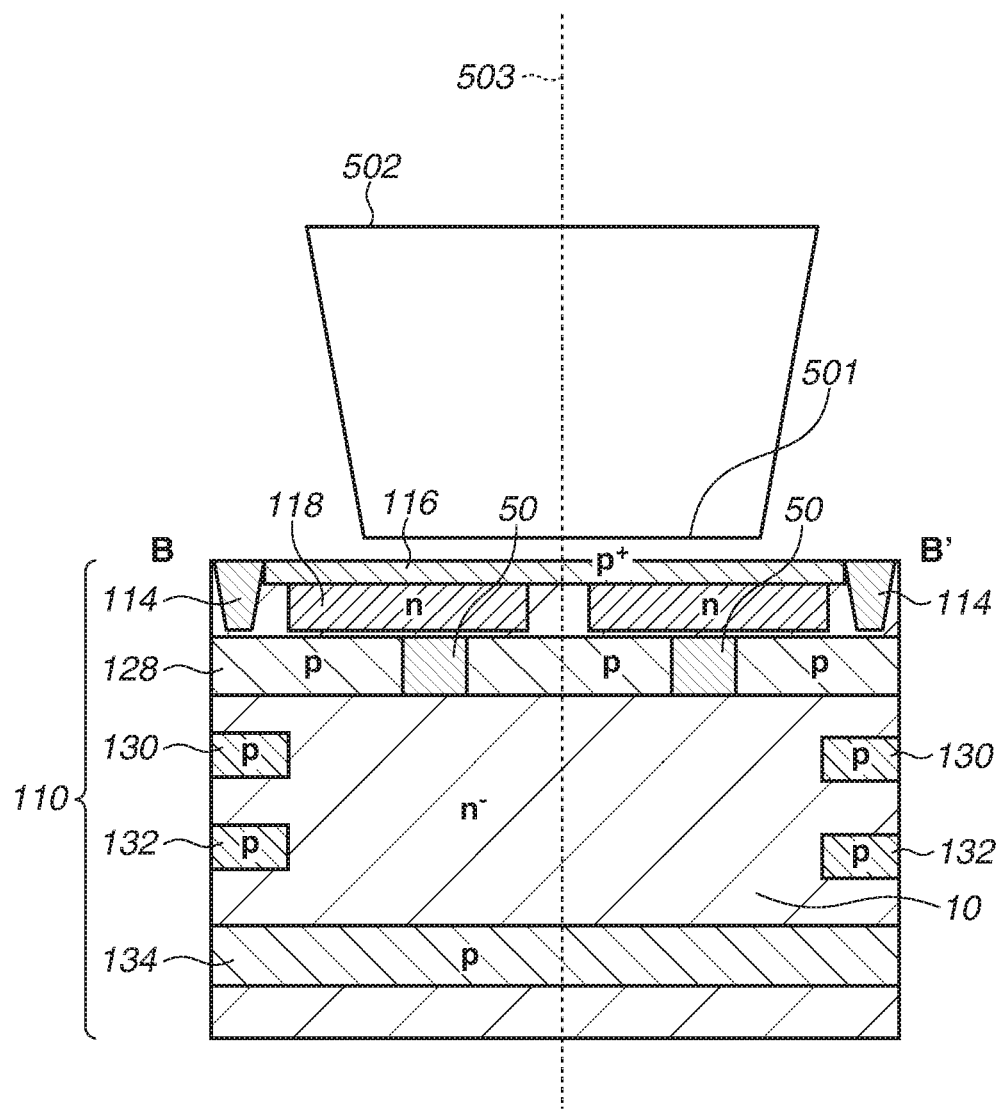
FIG. 15 illustrates a cross-sectional layout of the pixel of the solid-state imaging apparatus.

FIG. 15 is a cross-sectional view taken along a B-B' line illustrated in FIG. 14. The light guide is provided such that a central axis 503 of the light guide overlaps with a center of the two N-type semiconductor regions 118 overlapping with the light guide in the planar view. Further, the light guide is provided such that the central axis 503 overlaps with a center of the two depletion layers 50. The symmetry on these geometrical configuration leads to the accuracy of the focus detection based on the phase difference detection method.

In the following description, a third exemplary embodiment will be described. The present exemplary embodiment will be described, focusing on differences from the first exemplary embodiment.

An imaging apparatus according to the present exemplary embodiment covers both the configuration in which only one PD is provided in one pixel, and the configuration in which the plurality of PDs is provided in one pixel.

The present exemplary embodiment can be effectively applied to such a relatively large-sized PD that the length of one side thereof exceeds 5 µm.

Figure 11:
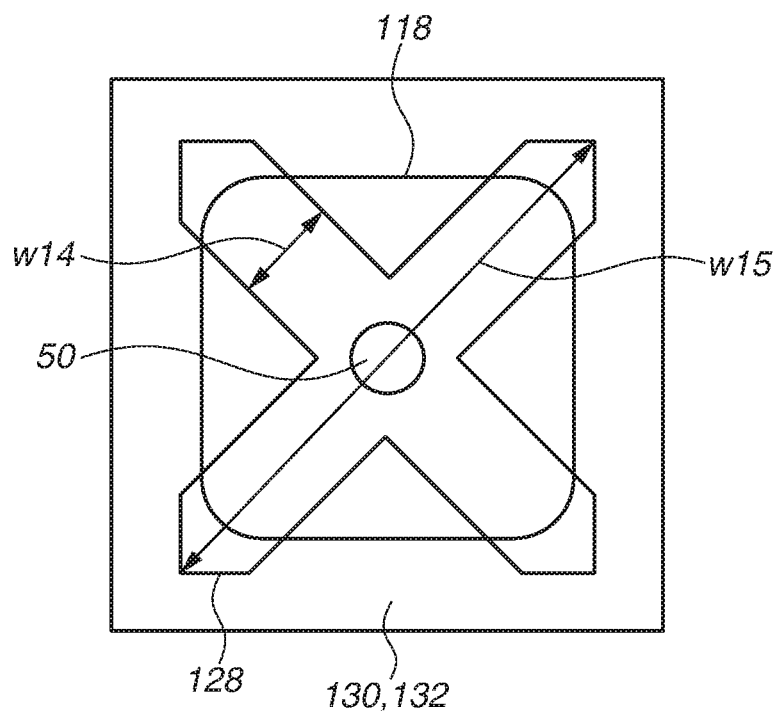
FIG. 11 illustrates a planar layout of a pixel of a solid-state imaging apparatus.

FIG. 11 illustrates a planar layout of the PD unit according to the present exemplary embodiment.

FIG. 11 illustrates the N-type semiconductor region 118, the P-type semiconductor regions 130 and 132 for isolating adjacent PDs from each other, and the depletion layer 50 in the P-type semiconductor region 128. Further, FIG. 11 illustrates a minimum width and a maximum width of the P-type semiconductor region 128 sandwiched by the P-type semiconductor region 130 as a width w14 and a width w15, respectively.

The other components illustrated in FIG. 1 are also included in the configuration illustrated in FIG. 11 in a similar manner, but are omitted here for simplification of the description.

The present exemplary embodiment is characterized by a layout of the P-type semiconductor regions 130 and 132 isolating the plurality of pixels 12 from one another, which are provided to realize the disclosed embodiments even when the size of the PD unit is relatively large.

As illustrated in FIG. 11, the P-type semiconductor regions 130 and 132 not only surround the N-type semiconductor region 118 but also have a region widely overlapping with the N-type semiconductor region 118 except for the vicinity of a central portion of the N-type semiconductor region 118. Due to this layout, the N-type semiconductor region 10 sandwiched by the P-type semiconductor regions 130 and 132 has a narrower width than the PD unit (the N-type semiconductor region 118). Designing the layout in this manner prevents a potential barrier in a vertical direction (a direction along the depth of the substrate) because the P-type semiconductor layer reduces the volume of the N-type semiconductor region 10. This can allow the imaging apparatus to easily increase the sensitivity of the PD unit.

However, as the maximum width of the N-type semiconductor region 10 sandwiched by the P-type semiconductor regions 130 and 132 becomes shorter than the length of the side of the PD unit, an area of a portion showing a flat potential in the horizontal direction increases in the P-type semiconductor regions 130 and 132. As a result, the imaging apparatus tends to show increase in a flow of the signal charge generated in the P-type semiconductor regions 130 and 132 to adjacent another pixel, i.e., a crosstalk.

When the area of the PD unit is relatively large, the embodiments can be realized with high sensitivity and low crosstalk by designing the planar layout of the P-type semiconductor regions 130 and 132 satisfying the following conditions.

1. The P-type semiconductor regions 130 and 132 planarly surround the N-type semiconductor region 118.
   However, the P-type semiconductor regions 130 and 132 are located under the P-type semiconductor region 128.
2. The P-type semiconductor regions 130 and 132 do not overlap with the central portion of the N-type semiconductor region 118 in the planar view.
3. The minimum width w14 of the N-type semiconductor region 10 surrounded by the P-type semiconductor regions 130 and 132 is set approximately to 4 µm or narrower.
4. The maximum width w15 of the N-type semiconductor region 10 surrounded by the P-type semiconductor regions 130 and 132 is set approximately to a shorter side length of the PD unit or wider.

The above-described condition 3 is a condition desirable to realize the high sensitivity of the PD unit. Further, regarding the condition 3, a desirable length of the minimum width w14 depends on the impurity concentration of the N-type semiconductor region 10. More specifically, the minimum width w14 increases as the impurity concentration of the N-type semiconductor region 10 decreases. For example, desirably, the minimum width w14 is set approximately to 4 μm, when the impurity concentration of semiconductor region 10 has approximately an impurity concentration of $5E14/cm^3$ (E represents a power of 10).

In this manner, according to the present exemplary embodiment, the imaging apparatus can realize both the high sensitivity and the high saturation, and further, the low crosstalk even when the area of the PD unit is large.

The present exemplary embodiment has been described as having the structure using the N-type semiconductor substrate, but is also applicable to the structure in which the N-type semiconductor region is provided in the P-type well region. However, in this case, the N-type semiconductor region 10 is replaced with the P-type semiconductor region, and therefore the above-described condition 3 does not have to be satisfied.

Figure 12:
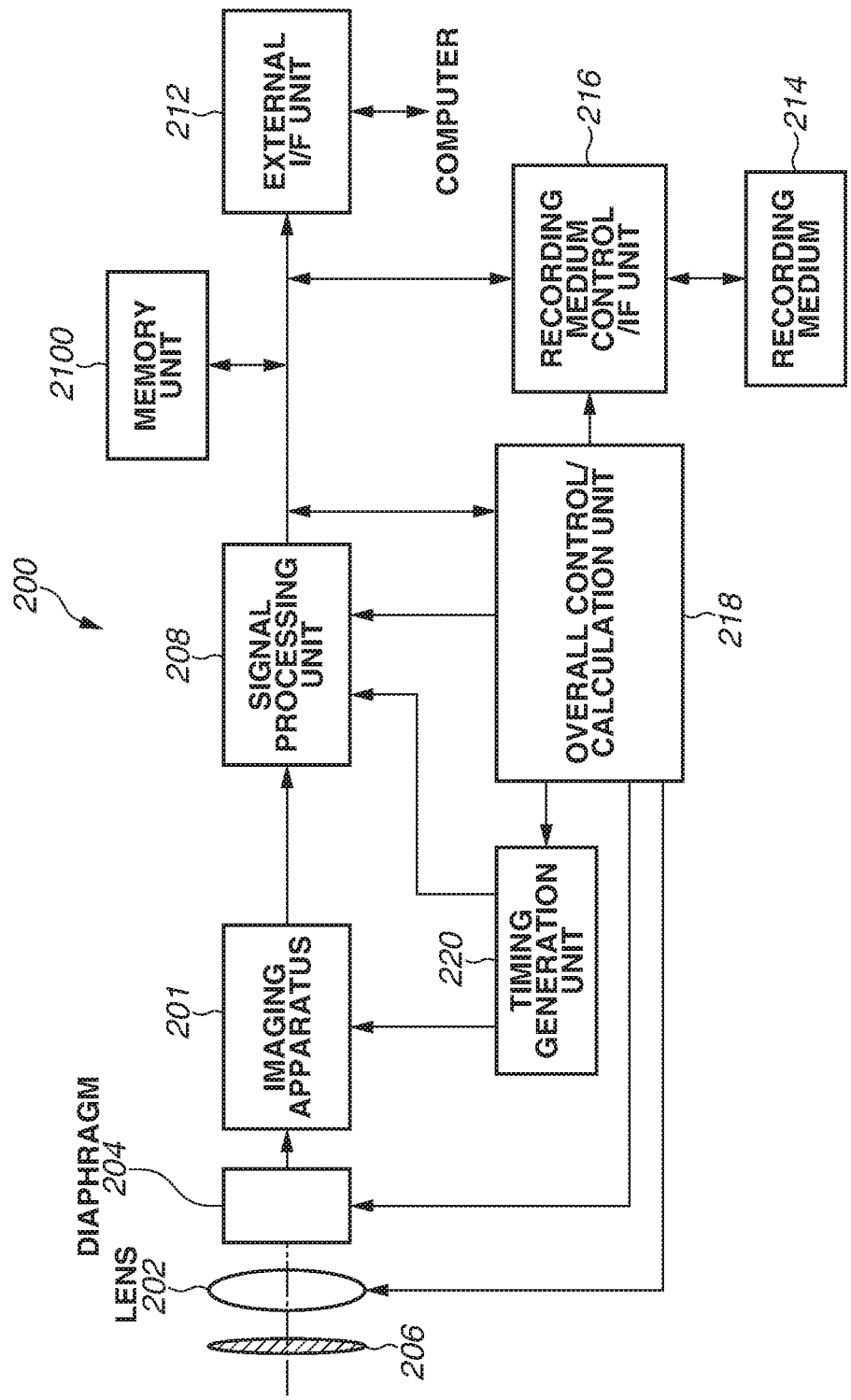
FIG. 12 is a block diagram illustrating a schematic configuration of an imaging system.

In the following description, a fourth exemplary embodiment will be described. An imaging system according to the present exemplary embodiment will be described with reference to FIG. 12. Similar components to the solid-state imaging apparatus according to each of the above-described exemplary embodiments will be identified by the same reference numerals, and descriptions thereof will be omitted or simplified. FIG. 12 is a block diagram illustrating a schematic configuration of the imaging system according to the present exemplary embodiment.

The solid-state imaging apparatus described in each of the above-described exemplary embodiments is applicable to various imaging systems as a solid-state imaging apparatus 200 illustrated in FIG. 12. Examples of the imaging system to which the solid-state imaging apparatus is applicable include a digital still camera, a digital camcorder, a monitoring camera, a copying machine, a facsimile machine, a mobile phone, an in-vehicle camera, and an observatory satellite. Further, the examples of the imaging system also include a camera module including an optical system such as a lens and an imaging apparatus. FIG. 12 illustrates a block diagram of the digital still camera as one example.

The imaging system 200 illustrated in FIG. 12 by way of example includes an imaging apparatus 201, a lens 202 for forming an optical image of a subject on the imaging apparatus 201, a diaphragm 204 for allowing light to pass through the lens 202 by a variable light amount, and a barrier 206 for protecting the lens 202. The lens 202 and the diaphragm 204 are an optical system that collects the light in the imaging apparatus 201. The imaging apparatus 201 is the solid-state imaging apparatus 100 described in any of the first to fifth exemplary embodiments, and converts the optical image formed by the lens 202 into image data.

The imaging system 200 further includes a signal processing unit 208, which processes a signal output from the imaging apparatus 201. The signal processing unit 208 carries out an AD conversion of converting an analog signal output from the imaging apparatus 201 into a digital signal. Further, the signal processing unit 208 outputs image data after carrying out various kinds of corrections and compressions as necessary. An AD conversion unit, which is a part of the signal processing unit 208, may be provided on a semiconductor substrate where the imaging apparatus 201 is mounted or may be provided on a semiconductor substrate separate from the imaging apparatus 201. Alternatively, the imaging apparatus 201 and the signal processing unit 208 may be provided on the same semiconductor substrate.

The imaging system 200 further includes a memory unit 2100 for temporarily storing the image data, and an external interface unit (an external I/F unit) 212 for communicating with an external computer and the like. The imaging system 200 further includes a recording medium 214 such as a semiconductor memory for recording or reading out imaging data, and a recording medium control interface unit (a recording medium control I/F unit) 216 for allowing the imaging data to be recorded into or read out from the recording medium 214. The recording medium 214 may be built in the imaging system 200 or may be detachably mounted.

The imaging system 200 further includes an overall control/calculation unit 218, which controls various kinds of calculations and the entire digital still camera, and a timing generation unit 220, which outputs various kinds of timing signals to the imaging apparatus 201 and the signal processing unit 208. The timing signal and the like may be input from outside the imaging system 200, and the imaging system 200 may be differently configured as long as the imaging system 200 includes at least the imaging apparatus 201 and the signal processing unit 208, which processes the output signal output from the imaging apparatus 201.

The imaging apparatus 201 outputs an imaging signal to the signal processing unit 208. The signal processing unit 208 performs predetermined signal processing on the imaging signal output from the imaging apparatus 201, and outputs the image data. The image processing unit 208 generates the image with use of the imaging signal.

An imaging system capable of stably acquiring a high-quality image with the high sensitivity and the large saturation signal amount can be realized by employing the solid-state imaging apparatus 100 according to each of the above-described exemplary embodiments.

Figure 13A:
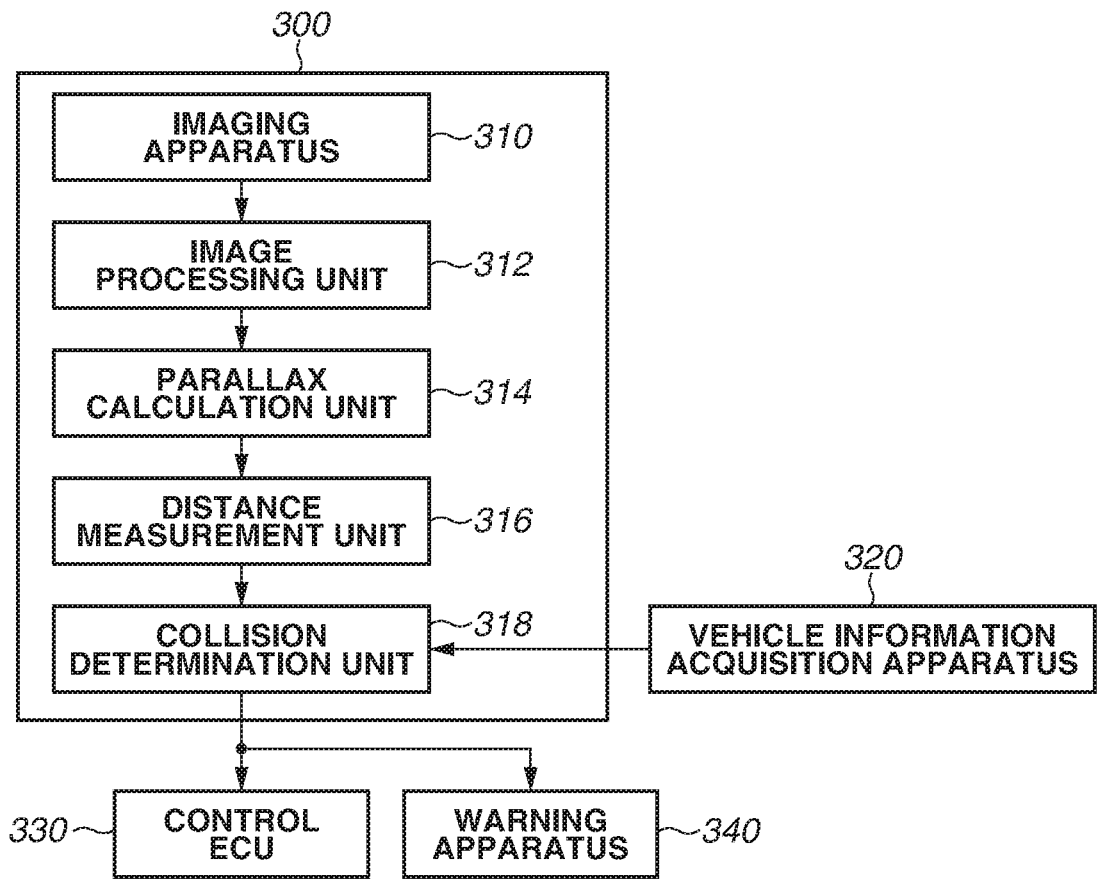
FIGS. 13A and 13B illustrate an example of a configuration of an imaging system and a moving object.
Figure 13B:
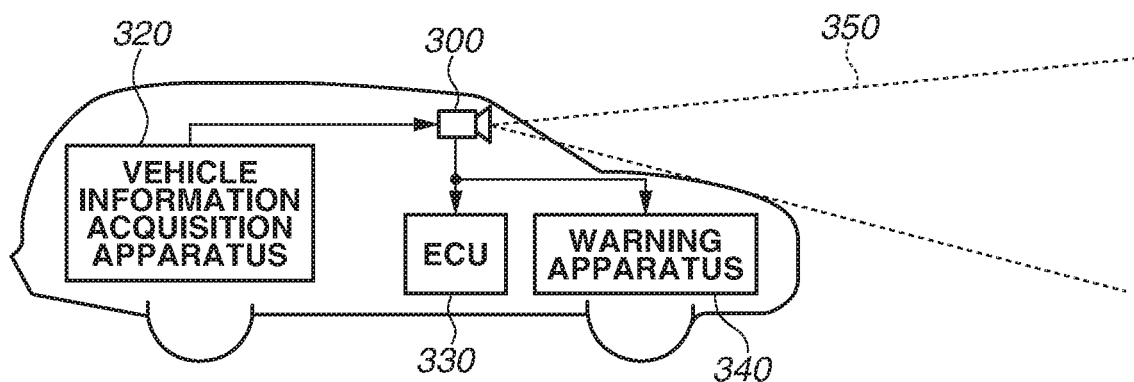

In the following description, a fifth exemplary embodiment will be described. An imaging system and a moving object according to the present exemplary embodiment will be described with reference to FIGS. 13A and 13B. FIGS. 13A and 13B illustrate a configuration of the imaging system and the moving object according to the present exemplary embodiment.

FIG. 13A illustrates one example of an imaging system regarding an in-vehicle camera. An imaging system 300 includes an imaging apparatus 310. The imaging apparatus 310 is the solid-state imaging apparatus 100 described in any of the above-described first to fifth exemplary embodiments. The imaging system 300 includes an image processing unit 312, which performs image processing on a plurality of image data acquired by the imaging apparatus 310, and a parallax calculation unit 314, which calculates a parallax (a phase difference between parallax images) from the plurality of image data acquired by the imaging system 300. Further, the imaging system 300 includes a distance measurement unit 316, which calculates a distance to a target based on the calculated parallax, and a collision determination unit 318, which determines whether there is a collision possibility based on the calculated distance. The parallax calculation unit 314 and the distance measurement unit 316 are examples of a distance information acquisition unit that acquires distance information to the target. In other words, the distance information refers to information regarding the parallax, a defocus amount, the distance to the target, and the like. The collision determination unit 318 may determine the collision possibility with use of any of the distance information. The distance information acquisition unit may be realized by hardware designed especially therefor or may be realized by a software module. Alternatively, the distance information acquisition unit may be realized by a field programmable gate array (FPGA), an application specific integrated circuit (ASIC), or the like, or may be realized by a combination of them.

The imaging system 300 is connected to a vehicle information acquisition apparatus 320, and can acquire vehicle information, such as a vehicle speed, a yaw rate, and a steering angle. Further, the imaging system 300 is connected to an electronic control unit (ECU) 330, which is a control apparatus that outputs a control signal for generating a braking force on the vehicle based on a result of the determination by the collision determination unit 318. Further, the imaging system 300 is connected to a warning apparatus 340, which issues a warning to a driver based on the result of the determination by the collision determination unit 318. For example, when the collision determination unit 318 determines that the collision possibility is high, the ECU 330 controls the vehicle to avoid the collision or reduce damage by, for example, braking the vehicle, returning an accelerator, and/or reducing an engine output. The warning apparatus 340 warns the user by, for example, emitting a warning such as a sound, displaying warning information on a screen of a car navigation system or the like, and/or vibrating a seat belt or a steering handle.

In the present exemplary embodiment, surroundings of the vehicle such as a scenery in front of or behind the vehicle are imaged by the imaging system 300. FIG. 13B illustrates the imaging system 300 when the imaging system 300 captures an image of the scenery in front of the vehicle (an imaging range 350). The vehicle information acquisition apparatus 320 transmits an instruction to the imaging system 300 or the imaging apparatus 310 to cause them to perform a predetermined operation. In such a configuration, the distance can be measured with further improved accuracy.

In the above description, the imaging system 300 has been described referring to the example that performs the control to prevent the vehicle from colliding with another vehicle, but is also applicable to performing control for autonomously driving the vehicle to cause the vehicle to follow the other vehicle, control for autonomously driving the vehicle to prevent the vehicle from departing from a traffic lane, and the like. Further, the imaging system 300 is applicable to not only the vehicle such as an automobile but also other moving objects (moving apparatuses) such as a ship, an airplane, or an industrial robot. In addition, the imaging system 300 is applicable to not only the moving objects but also widely applicable to an apparatus using object recognition, such as an intelligent transportation system (ITS).

Modified Exemplary Embodiments

The disclosure can be modified in various manners without being limited to the above-described exemplary embodiments.

Further, the exemplary embodiments include cases where a part of the configuration of the exemplary embodiment is added to another exemplary embodiment or is replaced with a part of the configuration of another exemplary embodiment.

Further, in the above-described exemplary embodiments, the solid-state imaging apparatus has been described, which uses the photoelectric conversion unit PD configured to generate the electron as the signal charge by way of example, but is also applicable to a solid-state imaging apparatus using a photoelectric conversion unit PD configured to generate a positive hole as the signal charge. In this case, the conductivity type of the semiconductor region forming each of the units in the pixel 12 is replaced with an opposite conductivity type. The sources and the drains of the transistors described in the above-described exemplary embodiments may be differently referred to according to the conductivity type of the transistor, a function of interest, or the like, and all or a part of the above-described sources and drains may be referred to by opposite names.

Further, the circuit configuration of the pixel 12 illustrated in FIG. 2 is one example, and can be changed as appropriate. The circuit of the pixel 12 may be differently configured as long as the pixel 12 includes at least the photoelectric conversion unit PD, and the transfer transistor M1, which transfers the charge from the photoelectric conversion unit PD to the charge holding unit. The disclosure is applicable to not only the CMOS image sensor but also the CCD image sensor. Further, the charge holding unit to which the charge is transferred from the photoelectric conversion unit PD does not necessarily have to be the floating diffusion FD as the input node of the amplification unit, and may be a charge holding unit other than the photoelectric conversion unit PD and the floating diffusion FD.

Any of the above-described exemplary embodiments merely indicates an example of embodiments of the disclosure when implementing the disclosure, and the technical scope of the disclosure shall not be limitedly construed by them. In other words, the disclosure can be implemented in various manners without departing from the technical idea thereof or the main features thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-121327, filed Jun. 26, 2018, which is hereby incorporated by reference herein in its entirety.

What is claimed is:

1. A photoelectric conversion apparatus comprising:
a plurality of pixels including a first pixel and a second pixel, each of the first pixel and the second pixel including a photoelectric conversion unit,
wherein each of the photoelectric conversion units includes a first semiconductor region having a first conductivity type where a signal charge is accumulated, and
wherein each of the first pixel and the second pixel includes:
a second semiconductor region having a second conductivity type opposite to the first conductivity type, the second semiconductor region disposed below the first semiconductor region continuously from one end of the first semiconductor region to another end thereof, the second semiconductor region being disposed below the first semiconductor region of the first pixel and the first semiconductor region of the second pixel so as to extend continuously from a region below the first semiconductor region of the first pixel to a region below the first semiconductor region of the second pixel,
a third semiconductor region having the second conductivity type, the third semiconductor region being disposed at a position between the plurality of first semiconductor regions in a planar view and deeper than the second semiconductor region, and a fourth semiconductor region having the first conductivity type and disposed below the first semiconductor region, wherein a fifth semiconductor region extends continuously from a region below the fourth semiconductor region of the first pixel to a region below the fourth semiconductor region of the second pixel.

2. The photoelectric conversion apparatus according to claim 1, wherein the plurality of pixels is arrayed across a plurality of rows and a plurality of columns, and wherein the second semiconductor region extends across the plurality of pixels.

3. The photoelectric conversion apparatus according to claim 2, wherein the fifth semiconductor region extends across the plurality of pixels.

4. The photoelectric conversion apparatus according to claim 3, wherein each of the photoelectric conversion units includes a sixth semiconductor region having the second conductivity type, the sixth semiconductor region disposed at a position shallower than the first semiconductor region.

5. The photoelectric conversion apparatus according to claim 2, wherein a part of a region in the second semiconductor region that is located below the first semiconductor region is depleted in a state where the charge is accumulated in the first semiconductor region.

6. The photoelectric conversion apparatus according to claim 1, wherein a part of a region in the second semiconductor region that is located below the first semiconductor region is depleted in a state where the charge is accumulated in the first semiconductor region.

7. An imaging system comprising:

the photoelectric conversion apparatus according to claim 1; and a signal processing unit configured to process a signal output from the pixel of the photoelectric conversion apparatus.

8. A moving object comprising:

the photoelectric conversion apparatus according to claim 1;

a distance information acquisition unit configured to acquire distance information to a target, from a parallax image based on a signal from the photoelectric conversion apparatus; and a control unit configured to control the moving object based on the distance information.

9. The photoelectric conversion apparatus according to claim 1, wherein each of the plurality of pixels includes a plurality of photoelectric conversion units with respect to one micro lens.

10. The photoelectric conversion apparatus according to claim 9, wherein a part of a region in the second semiconductor region that is located below the first semiconductor region is depleted in a state where the charge is accumulated in the first semiconductor region.

11. The photoelectric conversion apparatus according to claim 10, further comprising a light guide path configured to guide light to the plurality of photoelectric conversion units, wherein the light guide path is provided so as to overlap with the part to be depleted of the region located below the first semiconductor region in the planar view.

12. The photoelectric conversion apparatus according to claim 11, wherein the light guide path includes an incident surface on which the light is incident, and an emission surface from which the light is emitted to the plurality of photoelectric conversion units, and wherein the emission surface is provided so as to overlap with the part to be depleted of the region located below the first semiconductor region in the planar view.

13. The photoelectric conversion apparatus according to claim 1, wherein the second semiconductor region overlaps the entire first semiconductor region.

14. The photoelectric conversion apparatus according to claim 1, wherein the second semiconductor region is disposed below the first semiconductor region without a gap.

15. The photoelectric conversion apparatus according to claim 1, further comprising a first semiconductor substrate and a second semiconductor substrate, the first semiconductor substrate being provided with the photoelectric conversion unit of the first pixel and the photoelectric conversion unit of the second pixel, the second semiconductor substrate being provided with circuit processing signals from the photoelectric conversion unit of the first pixel and the photoelectric conversion unit of the second pixel.

16. The photoelectric conversion apparatus according to claim 15, wherein the first semiconductor substrate and the second semiconductor substrate are stacked on each other.

* * * * *